(12) United States Patent
Chen et al.

(10) Patent No.: US 12,119,320 B2
(45) Date of Patent: **\*Oct. 15, 2024**

(54) CHIP PACKAGE STRUCTURE WITH BUMP

(71) Applicant: Taiwan Semiconductor Manufacturing Co., Ltd., Hsinchu (TW)

(72) Inventors: Wei-Yu Chen, New Taipei (TW); Li-Hsien Huang, Zhubei (TW); An-Jhih Su, Taoyuan (TW); Hsien-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/869,118

(22) Filed: Jul. 20, 2022

(65) Prior Publication Data

US 2022/0359447 A1 Nov. 10, 2022

Related U.S. Application Data

(60) Continuation of application No. 17/106,941, filed on Nov. 30, 2020, now Pat. No. 11,410,956, which is a (Continued)

(51) Int. Cl.
*H01L 23/00* (2006.01)
*H01L 21/48* (2006.01)
(Continued)

(52) U.S. Cl.
CPC ............ *H01L 24/16* (2013.01); *H01L 21/486* (2013.01); *H01L 21/54* (2013.01); *H01L 21/565* (2013.01);
(Continued)

(58) Field of Classification Search
None
See application file for complete search history.

(56) References Cited

U.S. PATENT DOCUMENTS

| 8,361,842 B2 | 1/2013 | Yu et al. |
| 8,680,647 B2 | 3/2014 | Yu et al. |

(Continued)

FOREIGN PATENT DOCUMENTS

| CN | 102931173 A | 2/2013 |
| CN | 103730434 A | 4/2014 |

(Continued)

*Primary Examiner* — Alexander G Ghyka
(74) *Attorney, Agent, or Firm* — Slater Matsil, LLP

(57) ABSTRACT

A chip package structure is provided. The chip package structure includes a redistribution structure and a first chip structure over the redistribution structure. The chip package structure also includes a first solder bump between the redistribution structure and the first chip structure and a first molding layer surrounding the first chip structure. The chip package structure further includes a second chip structure over the first chip structure and a second molding layer surrounding the second chip structure. In addition, the chip package structure includes a third molding layer surrounding the first molding layer, the second molding layer, and the first solder bump. A portion of the third molding layer is between the first molding layer and the redistribution structure.

20 Claims, 18 Drawing Sheets

Related U.S. Application Data continuation of application No. 16/137,774, filed on Sep. 21, 2018, now Pat. No. 10,854,565, which is a continuation of application No. 15/857,976, filed on Dec. 29, 2017, now Pat. No. 10,083,927, which is a division of application No. 15/269,514, filed on Sep. 19, 2016, now Pat. No. 9,859,245.

(51) Int. Cl.

| | |
|---|---|
| H01L 21/54 | (2006.01) |
| H01L 21/56 | (2006.01) |
| H01L 23/31 | (2006.01) |
| H01L 23/498 | (2006.01) |
| H01L 25/00 | (2006.01) |
| H01L 25/065 | (2023.01) |

(52) U.S. Cl.
CPC .... *H01L 23/3114* (2013.01); *H01L 23/49827* (2013.01); *H01L 24/01* (2013.01); *H01L 24/11* (2013.01); *H01L 24/18* (2013.01); *H01L 25/0657* (2013.01); *H01L 25/50* (2013.01); *H01L 2224/02372* (2013.01); *H01L 2224/11849* (2013.01); *H01L 2224/16013* (2013.01); *H01L 2224/16104* (2013.01); *H01L 2224/16221* (2013.01); *H01L 2225/06517* (2013.01); *H01L 2225/06541* (2013.01)

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,859,245 | B1* | 1/2018 | Chen ................. H01L 23/49827 |
| 10,083,927 | B2 | 9/2018 | Chen et al. |
| 10,854,565 | B2 | 12/2020 | Chen et al. |
| 2006/0027841 | A1 | 2/2006 | Tamaki |
| 2009/0011541 | A1 | 1/2009 | Corisis et al. |
| 2009/0051024 | A1* | 2/2009 | Chia ....................... H01L 24/82 |
| | | | 257/690 |
| 2011/0291288 | A1 | 12/2011 | Wu et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0264684 | A1 | 10/2013 | Yu et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0235017 | A1 | 8/2014 | Hwang et al. |
| 2014/0252646 | A1 | 9/2014 | Hung et al. |
| 2014/0264930 | A1 | 9/2014 | Yu et al. |
| 2015/0200185 | A1 | 7/2015 | Yu et al. |
| 2015/0235936 | A1 | 8/2015 | Yu et al. |
| 2015/0270247 | A1 | 9/2015 | Chen et al. |
| 2015/0294939 | A1 | 10/2015 | Yu et al. |
| 2015/0303174 | A1 | 10/2015 | Yu et al. |
| 2016/0148904 | A1 | 5/2016 | Zhai et al. |
| 2016/0311507 | A1 | 10/2016 | Greenan et al. |
| 2016/0315071 | A1 | 10/2016 | Zhai et al. |
| 2016/0322330 | A1 | 11/2016 | Lin et al. |
| 2016/0343685 | A1 | 11/2016 | Lin et al. |
| 2017/0098628 | A1 | 4/2017 | Liu et al. |
| 2017/0141080 | A1 | 5/2017 | Chen et al. |
| 2017/0005052 | A1 | 11/2017 | Chen et al. |
| 2017/0323866 | A1 | 11/2017 | Shih |
| 2018/0337160 | A1 | 11/2018 | Drab et al. |
| 2019/0206838 | A1 | 7/2019 | Lou |
| 2019/0333893 | A1 | 10/2019 | Yu et al. |

FOREIGN PATENT DOCUMENTS

| | | |
|---|---|---|
| CN | 105374693 A | 3/2016 |
| CN | 105895599 A | 8/2016 |

\* cited by examiner

CHIP PACKAGE STRUCTURE WITH BUMP

PRIORITY AND CROSS REFERENCE

This application is a continuation of U.S. patent application Ser. No. 17/106,941, filed on Nov. 30, 2020, which is a continuation of U.S. patent application Ser. No. 16/137,774, filed on Sep. 21, 2018, now U.S. Pat. No. 10,854,565 issued Dec. 1, 2020, which is a continuation of U.S. patent application Ser. No. 15/857,976, filed on Dec. 29, 2017, now U.S. Pat. No. 10,083,927 issued Sep. 25, 2018, which is a divisional of U.S. patent application Ser. No. 15/269,514, filed on Sep. 19, 2016, now U.S. Pat. No. 9,859,245 issued Jan. 2, 2018, the entirety of each is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform and performance of the ICs continues to become easier to be affected by processes (e.g. thermal processes). Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1G-1 is an enlarged cross-sectional view of the solder bump and the conductive pillar of FIG. 1G, in accordance with some embodiments.

DETAILED DESCRIPTION

Figure 1A:
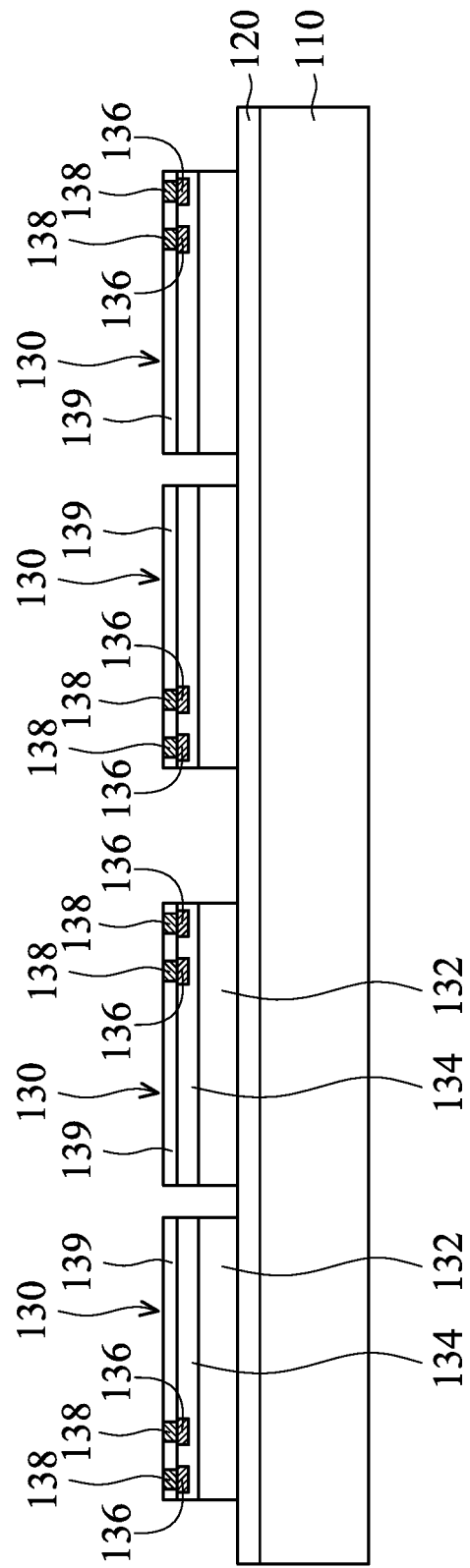
FIGS. 1A-1J are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1J are cross-sectional views of various stages of a process for forming a chip package structure, in accordance with some embodiments.

As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, a combination thereof, and/or the like, in accordance with some embodiments. The carrier substrate 110 includes a wafer, in accordance with some embodiments.

As shown in FIG. 1A, an adhesive layer 120 is formed over the carrier substrate 110, in accordance with some embodiments. The adhesive layer 120 includes any suitable adhesive material, such as a polymer material, in accordance with some embodiments. For example, the adhesive layer 120 includes an ultraviolet (UV) glue, which loses its adhesive properties when exposed to UV light, in accordance with some embodiments. In some embodiments, the adhesive layer 120 includes a double-sided adhesive tape. The adhesive layer 120 is formed using a lamination process, a spin coating process, or another suitable process.

As shown in FIG. 1A, chip structures 130 are provided over the adhesive layer 120, in accordance with some embodiments. Each of the chip structures 130 includes a chip 132, a dielectric layer 134, bonding pads 136, interconnection structures 138, and a passivation layer 139, in accordance with some embodiments. The dielectric layer 134 is formed over the chip 132, in accordance with some embodiments.

The dielectric layer 134 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 134 is formed using a CVD process, a HDPCVD process, a spin-on process, a sputtering process, or a combination thereof, in accordance with some embodiments.

The bonding pads 136 are embedded in the dielectric layer 134, in accordance with some embodiments. The bonding pads 136 are electrically connected to devices (not shown) formed in/over the chip 132, in accordance with some embodiments. The interconnection structures 138 are formed over the respective bonding pads 136, in accordance with some embodiments.

The interconnection structures 138 include conductive pillars or conductive bumps, in accordance with some embodiments. The passivation layer 139 is formed over the dielectric layer 134 and surrounds the interconnection structures 138, in accordance with some embodiments. The passivation layer 139 includes a polymer material or another suitable insulating material.

Figure 1B:
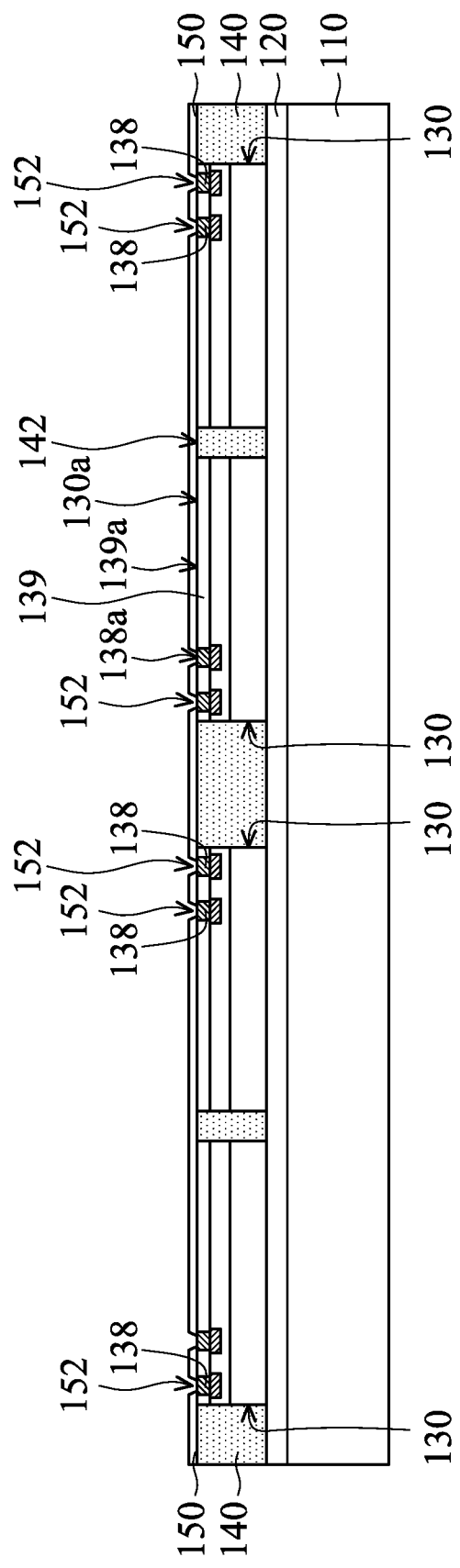

As shown in FIG. 1B, a molding layer 140 is formed over the carrier substrate 110 and the adhesive layer 120, in accordance with some embodiments. The molding layer 140 surrounds the chip structures 130, in accordance with some embodiments. In some embodiments, portions of the molding layer 140 are located between the chip structures 130. The molding layer 140 includes a polymer material or another suitable insulating material.

The formation of the molding layer 140 includes forming a molding compound material layer over the adhesive layer 120; performing a curing process to cross-link (or thermoset) the polymers of the molding compound material layer; and performing a grinding process over the molding compound material layer until the interconnection structures 138 are exposed, in accordance with some embodiments. Therefore, top surfaces 138a, 139a, 130a, and 142 of the interconnection structures 138, the passivation layer 139, the chip structures 130, and the molding layer 140 are coplanar (or aligned with each other), in accordance with some embodiments.

As shown in FIG. 1B, an insulating layer 150 is formed over the molding layer 140 and the chip structures 130, in accordance with some embodiments. The insulating layer 150 is a continuous layer, in accordance with some embodiments. The insulating layer 150 has holes 152 over the interconnection structures 138, in accordance with some embodiments. The holes 152 respectively expose the interconnection structures 138 thereunder, in accordance with some embodiments.

Figure 1C:
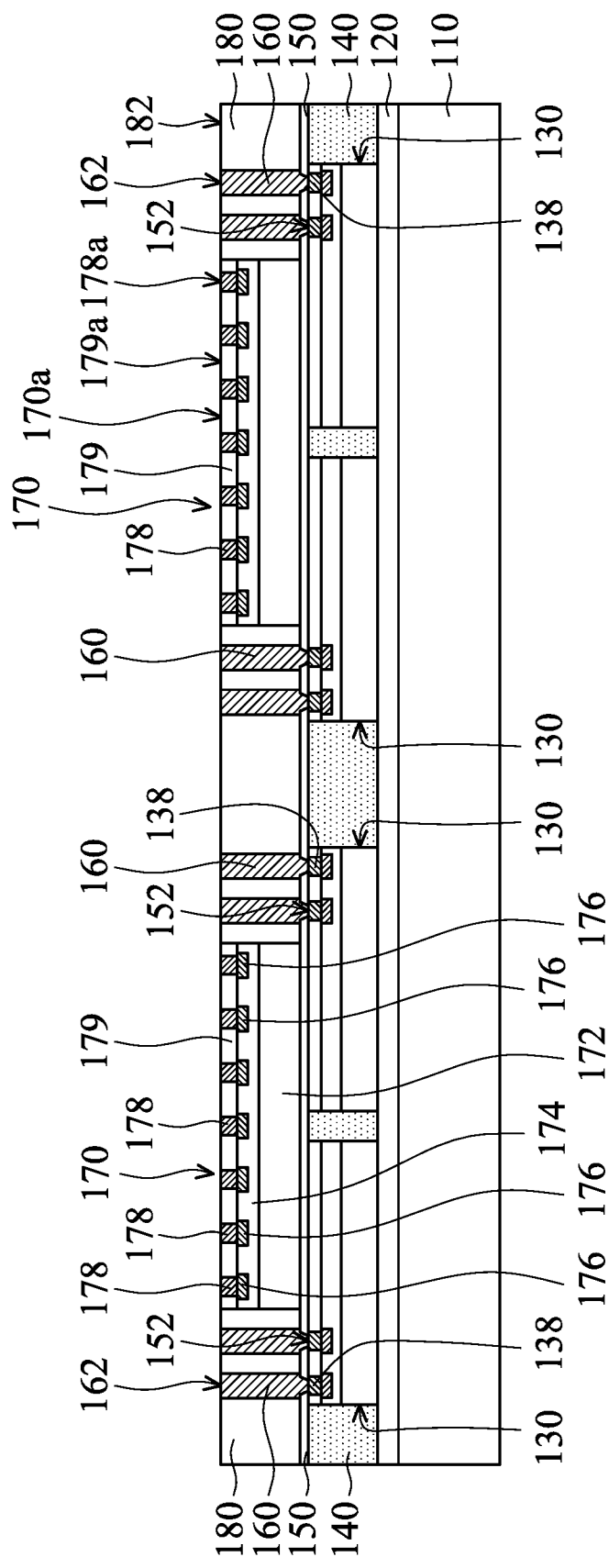

As shown in FIG. 1C, conductive via structures 160 are formed in and over the holes 152 to be electrically connected to the interconnection structures 138, respectively, in accordance with some embodiments. The conductive via structures 160 include copper or another suitable conductive material.

As shown in FIG. 1C, chip structures 170 are provided over the insulating layer 150, in accordance with some embodiments. The chip structures 170 are positioned over the chip structures 130 and the molding layer 140, in accordance with some embodiments.

In some embodiments, a portion of each of the chip structures 130 is exposed by the chip structures 170. The chip structures 170 are between the conductive via structures 160, in accordance with some embodiments. The conductive via structures 160 surround the chip structures 170, in accordance with some embodiments.

Each of the chip structures 170 includes a chip 172, a dielectric layer 174, bonding pads 176, interconnection structures 178, and a passivation layer 179, in accordance with some embodiments. The dielectric layer 174 is formed over the chip 172, in accordance with some embodiments.

The dielectric layer 174 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 174 is formed using a CVD process, a HDPCVD process, a spin-on process, a sputtering process, or a combination thereof, in accordance with some embodiments.

The bonding pads 176 are embedded in the dielectric layer 174, in accordance with some embodiments. The bonding pads 176 are electrically connected to devices (not shown) formed in/over the chip 172, in accordance with some embodiments. The interconnection structures 178 are formed over the bonding pads 176 respectively, in accordance with some embodiments.

The interconnection structures 178 include conductive pillars or conductive bumps, in accordance with some embodiments. The passivation layer 179 is formed over the dielectric layer 174 and surrounds the interconnection structures 178, in accordance with some embodiments. The passivation layer 179 includes a polymer material or another suitable insulating material.

As shown in FIG. 1C, a molding layer 180 is formed over the insulating layer 150, in accordance with some embodiments. The insulating layer 150 separates the molding layer 140 and the chip structures 130 from the molding layer 180 and the chip structures 170, in accordance with some embodiments. The molding layer 180 is over the chip structures 130 and the molding layer 140, in accordance with some embodiments.

The molding layer 180 surrounds the chip structures 170 and the conductive via structures 160, in accordance with some embodiments. In some embodiments, portions of the molding layer 180 are between the chip structures 170 and the conductive via structures 160. The molding layer 180 includes a polymer material or another suitable insulating material.

The formation of the molding layer 180 includes forming a molding compound material layer over the insulating layer 150; performing a curing process to cross-link (or thermoset) the polymers of the molding compound material layer; and performing a grinding process over the molding compound material layer until the conductive via structures 160 and the interconnection structures 178 are exposed, in accordance with some embodiments.

Therefore, top surfaces 178a, 179a, 170a, 162, and 182 of the interconnection structures 178, the passivation layer 179, the chip structures 170, the conductive via structures 160, and the molding layer 180 are coplanar (or aligned with each other), in accordance with some embodiments. The conductive via structures 160 pass through the molding layer 180, in accordance with some embodiments.

Figure 1D:
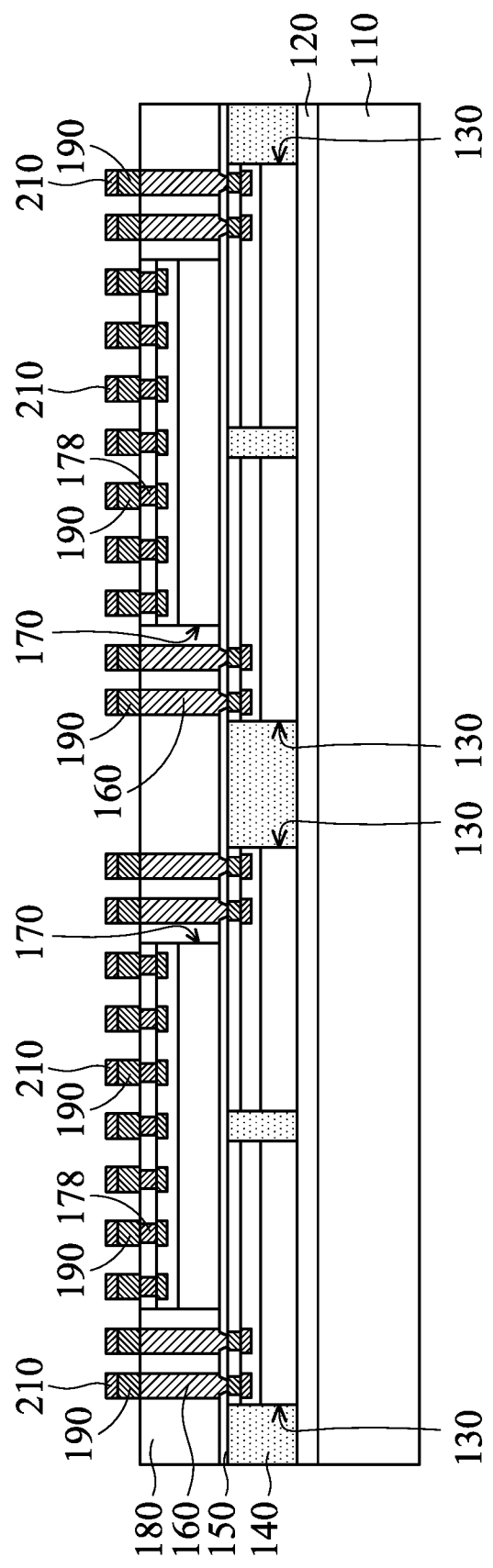

As shown in FIG. 1D, conductive pillars 190 are formed over the conductive via structures 160 and the interconnection structures 178, respectively, in accordance with some embodiments. The conductive pillars 190 are in direct contact with the conductive via structures 160 thereunder and the interconnection structures 178 thereunder, respectively, in accordance with some embodiments.

The conductive pillars 190 include copper or another suitable conductive material. The conductive pillars 190 do not include tin (Sn), in accordance with some embodiments. The conductive pillars 190 are formed using a plating process, in accordance with some embodiments.

As shown in FIG. 1D, solder bumps 210 are formed over the conductive pillars 190, in accordance with some embodiments. The solder bumps 210 are in direct contact with the conductive pillars 190, in accordance with some embodiments. Some of the conductive pillars 190 are between the chip structures 170 and the solder bumps 210, in accordance with some embodiments.

Some of the conductive pillars 190 are between the conductive via structures 160 and the solder bumps 210, in accordance with some embodiments. The solder bumps 210 include tin, silver, gold, lead, or another suitable solder material. The solder bumps 210 and the conductive pillars 190 are made of different materials, in accordance with some embodiments. The solder bumps 210 are formed using an electroplating process, in accordance with some embodiments.

Figure 1E:
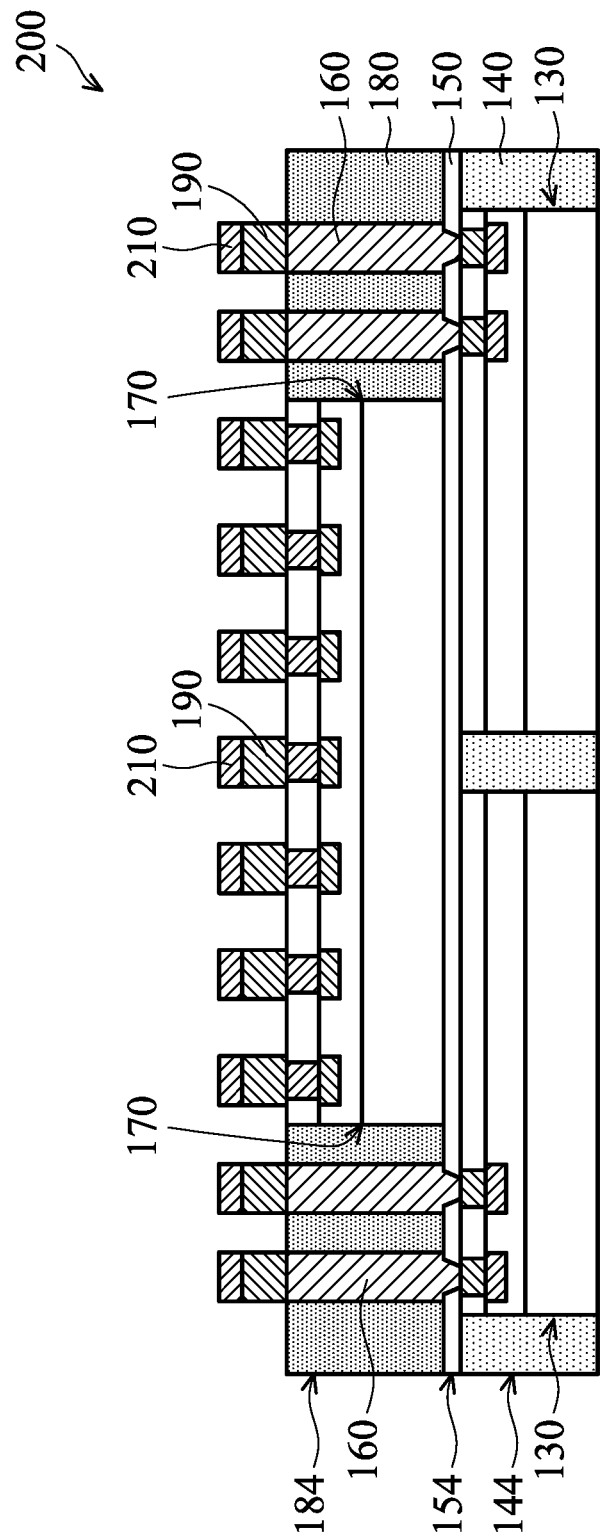

As shown in FIG. 1E, the chip structures 130 and the molding layer 140 are debonded from the carrier substrate 110, in accordance with some embodiments. The debonding process includes performing a thermal process over the adhesive layer 120, in accordance with some embodiments. For example, the adhesive layer 120 is irradiated with UV light to weaken the adhesive properties of the adhesive layer 120.

As shown in FIG. 1E, a sawing process is performed over the molding layer 180, the insulating layer 150, and the molding layer 140 to form individual chip package structures 200, in accordance with some embodiments. Each of the chip package structures 200 includes the chip structures 130, the molding layer 140, the insulating layer 150, the conductive via structures 160, the chip structures 170, the molding layer 180, the conductive pillars 190, and the solder bumps 210, in accordance with some embodiments.

The chip package structures 200 are multi-chip stacked package structures, in accordance with some embodiments. In each of the chip package structures 200, sidewalls 184, 154, and 144 of the molding layer 180, the insulating layer 150, and the molding layer 140 are coplanar, in accordance with some embodiments.

Figure 1F:
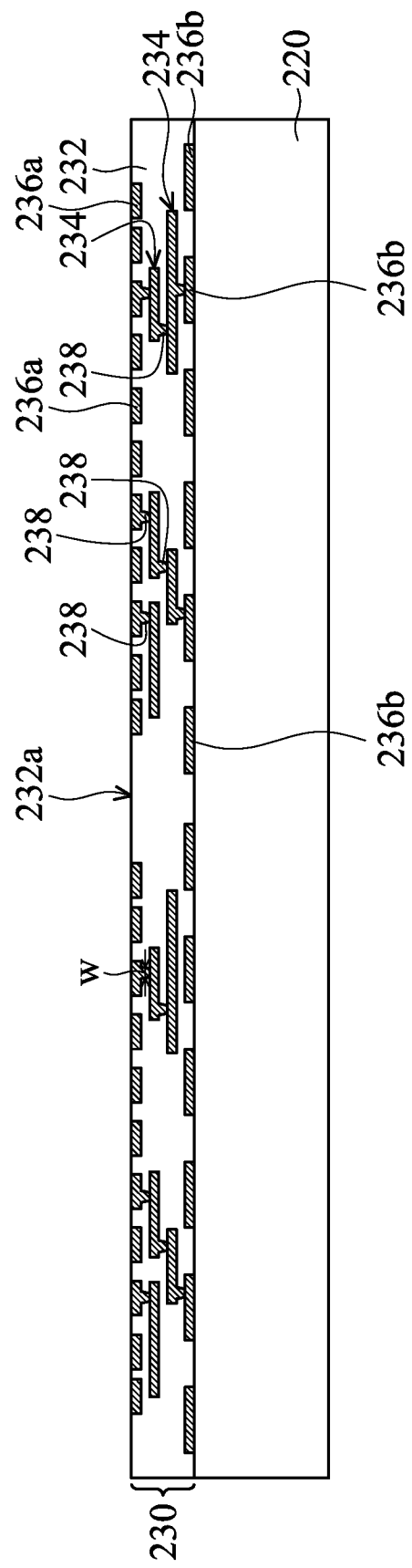

As shown in FIG. 1F, a carrier substrate 220 is provided, in accordance with some embodiments. The carrier substrate 220 is configured to provide temporary mechanical and structural support during subsequent processing steps, in accordance with some embodiments. The carrier substrate 220 includes glass, silicon oxide, aluminum oxide, a combination thereof, and/or the like, in accordance with some embodiments.

As shown in FIG. 1F, a redistribution structure 230 is separately formed over the carrier substrate 220 (rather than being integrally formed on the chip package structure 200), in accordance with some embodiments. The redistribution structure 230 includes a dielectric layer 232, wiring layers 234, conductive pads 236a and 236b, and conductive vias 238, in accordance with some embodiments. The dielectric layer 232 has a top surface 232a, in accordance with some embodiments.

The wiring layers 234 and conductive vias 238 are in the dielectric layer 232, in accordance with some embodiments. The conductive pads 236a are over the dielectric layer 232, in accordance with some embodiments. The conductive pads 236b are under the dielectric layer 232, in accordance with some embodiments.

The conductive vias 238 are between the conductive pads 236a and 236b and the wiring layers 234, in accordance with some embodiments. Therefore, the conductive pads 236a and 236b and the wiring layers 234 are able to be electrically connected to each other through the conductive vias 238 according to design requirements, in accordance with some embodiments. The width W of each of the conductive vias 238 continuously increases toward the top surface 232a of the dielectric layer 232, in accordance with some embodiments.

Figure 1G:
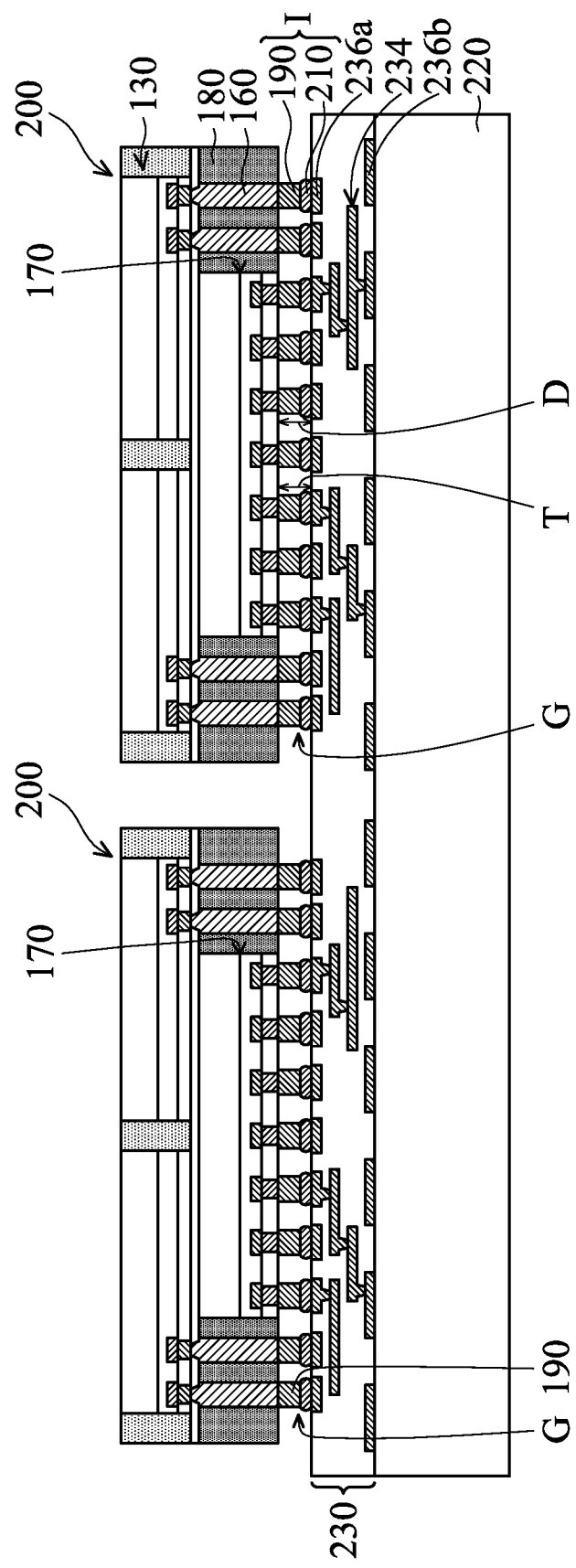

As shown in FIG. 1G, the chip package structures 200 are flipped up and disposed over the redistribution structure 230, in accordance with some embodiments. The solder bumps 210 are disposed over the respective conductive pads 236a, in accordance with some embodiments. Thereafter, a reflow process is performed on the solder bumps 210, in accordance with some embodiments.

The conductive pillars 190 are made of a first conductive material, and the solder bumps 210 are made of a second conductive material, in accordance with some embodiments. A first melting point of the first conductive material is higher than a second melting point of the second conductive material, in accordance with some embodiments.

A temperature of the reflow process is between the first melting point and the second melting point, in accordance with some embodiments. Therefore, during the reflow process, the solder bumps 210 are melted and bonded to the conductive pads 236a and the conductive pillars 190, in accordance with some embodiments.

Figures 1, 1G:
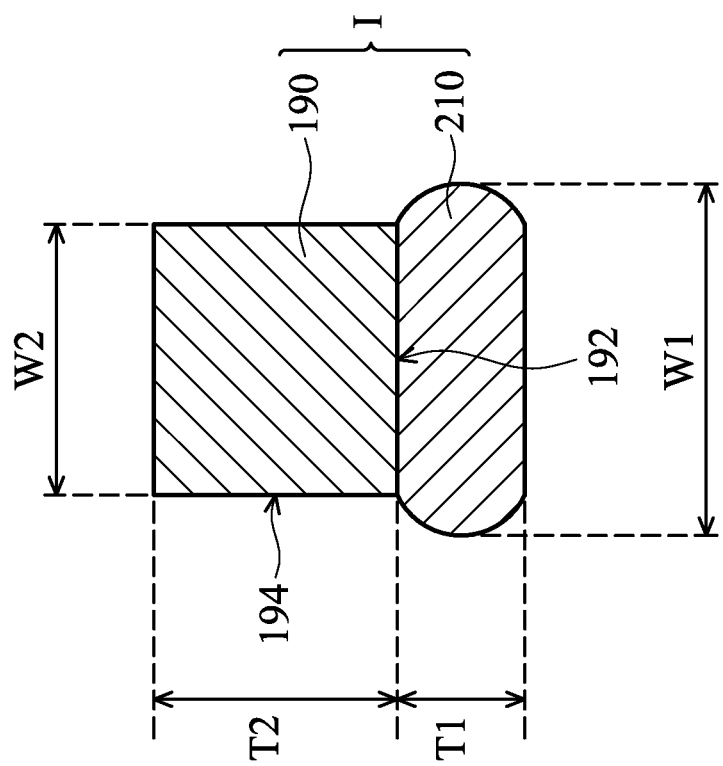

FIG. 1G-1 is an enlarged cross-sectional view of the solder bump 210 and the conductive pillar 190 of FIG. 1G, in accordance with some embodiments. After the reflow process, as shown in FIGS. 1G and 1G-1, the solder bump 210 covers a bottom surface 192 of the conductive pillar 190 over the solder bump 210, in accordance with some embodiments. In some embodiments (not shown), the solder bump 210 further covers a portion of sidewalls 194 of the conductive pillar 190 over the solder bump 210, in accordance with some embodiments.

A thickness T2 of the conductive pillar 190 is greater than a thickness T1 of the solder bump 210 thereunder, in accordance with some embodiments. A maximum width W1 of the solder bump 210 is greater than a maximum width W2 of the conductive pillar 190 thereover, in accordance with some embodiments.

The conductive pillar 190 and the solder bump 210 thereunder together form an interconnect structure I, in accordance with some embodiments. A thickness T of the interconnect structure I is substantially equal to a distance D between the chip structure 170 (or the molding layer 180) and the redistribution structure 230, in accordance with some embodiments. The thickness T (or the distance D) ranges between about 20 μm to about 30 μm, in accordance with some embodiments.

The molding layer 180 and the chip structure 170 are both spaced apart from the redistribution structure 230 by a gap G, in accordance with some embodiments. The conductive pillars 190 and the solder bumps 210 are positioned in the gap G, in accordance with some embodiments.

Since the conductive pillars 190 are not melted during the reflow process, the conductive pillars 190 may maintain the thickness T of the interconnect structure I, and therefore the conductive pillars 190 may maintain the distance D in a suitable range as well. Therefore, during the subsequent processes, a molding compound material may be filled into the gap G easily.

Furthermore, the formation of the conductive pillar 190 may reduce the volume of the solder bump 210 thereunder while maintaining the same distance D, which prevents the solder bump 210 from shorting to the adjacent solder bumps 210 during the reflow process.

Figure 1H:
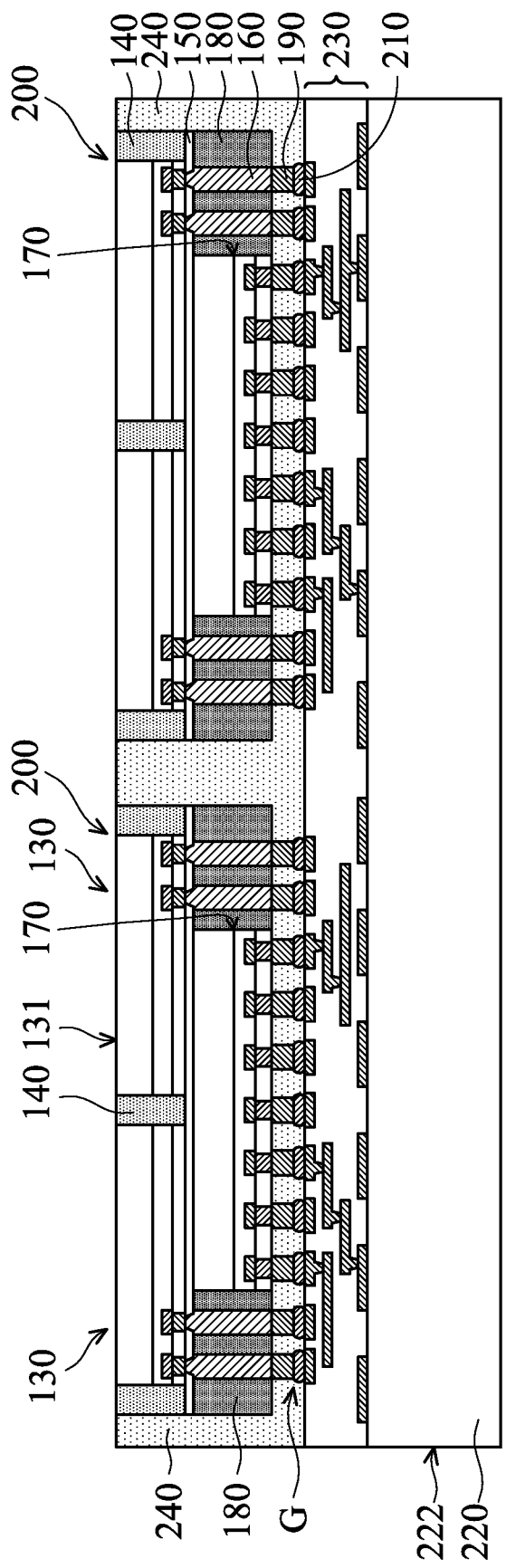

As shown in FIG. 1H, a molding layer 240 is formed over the redistribution structure 230, in accordance with some embodiments. The molding layer 240 surrounds the chip package structures 200, in accordance with some embodiments.

That is, the molding layer 240 surrounds the chip structures 130, the molding layer 140, the insulating layer 150, the conductive via structures 160, the chip structures 170, the molding layer 180, the conductive pillars 190, and the solder bumps 210, in accordance with some embodiments.

The molding layer 240 is filled into the gap G, in accordance with some embodiments. The molding layer 240 is in direct contact with the solder bumps 210, the conductive pillars 190, the redistribution structure 230, the molding layers 140 and 180, and the insulating layer 150, in accordance with some embodiments. The molding layer 240 includes a polymer material or another suitable insulating material.

The formation of the molding layer 240 includes forming a molding compound material layer over the redistribution structure 230 and the chip package structures 200; performing a curing process to cross-link (or thermoset) the polymers of the molding compound material layer; and performing a grinding process over the molding compound material layer until the top surfaces 131 of the chip structures 130 are exposed, in accordance with some embodiments.

Figure 1I:
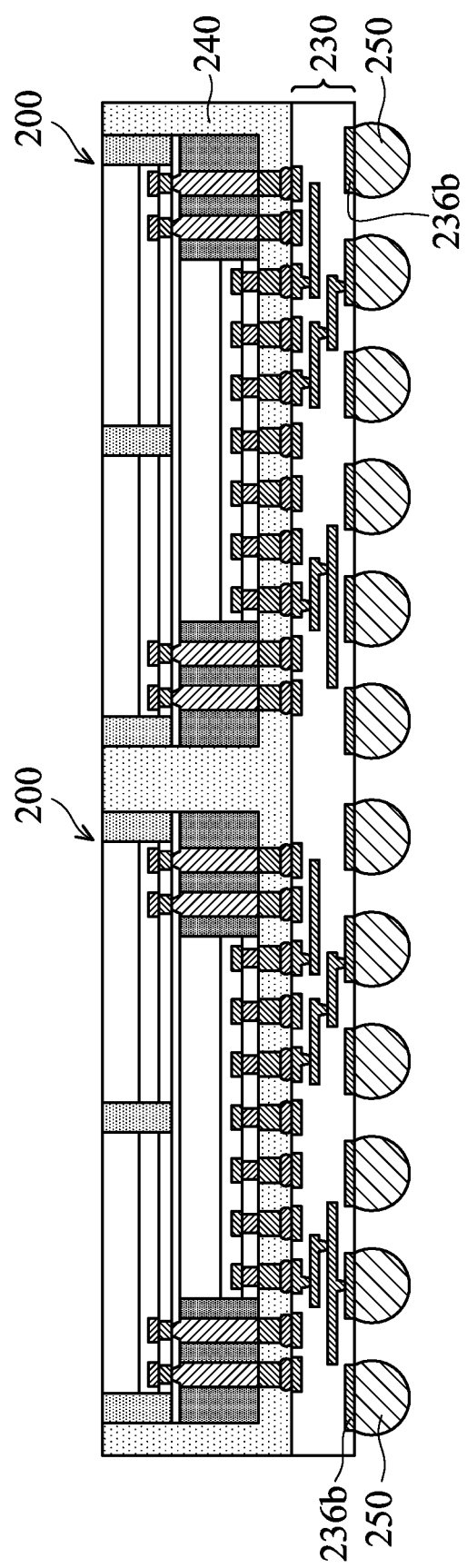

As shown in FIG. 1I, the carrier substrate 220 is removed, in accordance with some embodiments. As shown in FIG. 1I, conductive bumps 250 are formed over the conductive pads 236b, respectively, in accordance with some embodiments. The conductive bumps 250 include tin (Sn) or another suitable conductive material. The formation of the conductive bumps 250 includes forming a solder paste over the conductive pads 236b and reflowing the solder paste, in accordance with some embodiments.

Figure 1J:
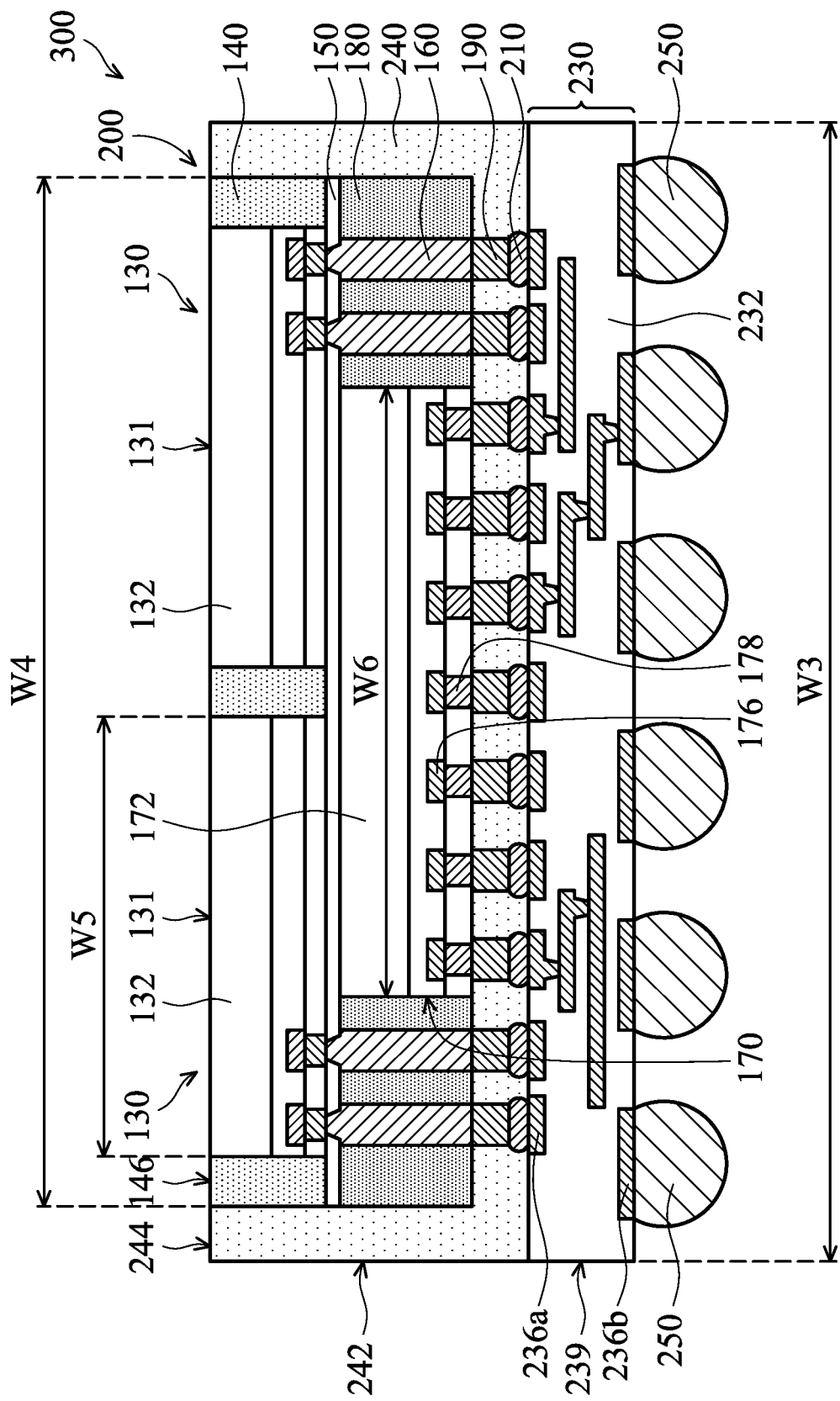

As shown in FIG. 1J, a sawing process is performed over the molding layer 240 and the redistribution structure 230 to form individual chip package structures 300, in accordance with some embodiments. Each of the chip package structures 300 includes the chip package structure 200, the molding layer 240, the redistribution structure 230, and the conductive bumps 250, in accordance with some embodiments. In the chip package structure 300, a sidewall 242 of the molding layer 240 and a sidewall 239 of the redistribution structure 230 are coplanar, in accordance with some embodiments.

In the chip package structure 300, a top surface 244 of the molding layer 240, a top surface 131 of the chip structure 130, and a surface 146 of the molding layer 140 are coplanar, in accordance with some embodiments. The conductive pillars 160 pass through the molding layer 180, in accordance with some embodiments. The molding layer 240 continuously surrounds the entire chip package structures 200, in accordance with some embodiments.

The molding layer 240 is a single layer structure, in accordance with some embodiments. The molding layer 240 does not cover the top surfaces 131 of the chip structures 130, in accordance with some embodiments. The molding layer 140 does not cover the top surfaces 131 of the chip structures 130, in accordance with some embodiments. The chip package structure 300 is a fan-out chip package structure, in accordance with some embodiments.

In some embodiments, a width W3 of the redistribution structure 230 is greater than a width W4 of the chip package structure 200. In some embodiments, the width W4 is greater than a width W5 of the chip structure 130 or a width W6 of the chip structure 170.

The process of FIGS. 1A-1J includes forming the chip package structures 200; bonding the chip package structures 200 to the redistribution structure 230; forming the molding layer 240 over the redistribution structure 230 and between the chip package structures 200; and performing a sawing process to form the individual chip package structures 300, in accordance with some embodiments.

Since the chip package structure 200 and the redistribution structure 230 are formed individually, the chips 132 and 172 of the chip package structures 200 are prevented from being affected by the thermal processes for forming the dielectric layer 232 of the redistribution structure 230. Therefore, the performance of the chips 132 and 172 is maintained, in accordance with some embodiments.

Furthermore, since the chip package structure 200 and the redistribution structure 230 are formed individually, the chip package structure 200 and the redistribution structure 230 are able to be formed simultaneously. Therefore, the cycle time (or the processing time) for forming the chip package structure 300 is reduced, in accordance with some embodiments.

In some embodiments, an electrical property test (e.g. a final test) is performed over the conductive pillars 190 and the solder bumps 210 of FIG. 1D to identify known good dies (KGDs). In some embodiments, an electrical property test (e.g. a final test) is performed over the redistribution structure 230 of FIG. 1F to identify known good redistribution layers.

Thereafter, in the step illustrated in FIG. 1G, the chip package structures 200 with the known good dies are picked up and disposed over the redistribution structure 230 with the known good redistribution layers to form the chip package structures 300 with the known good dies and known good redistribution layers, in accordance with some embodiments. Therefore, the yield of the chip package structures 300 is improved, in accordance with some embodiments.

Figure 2:
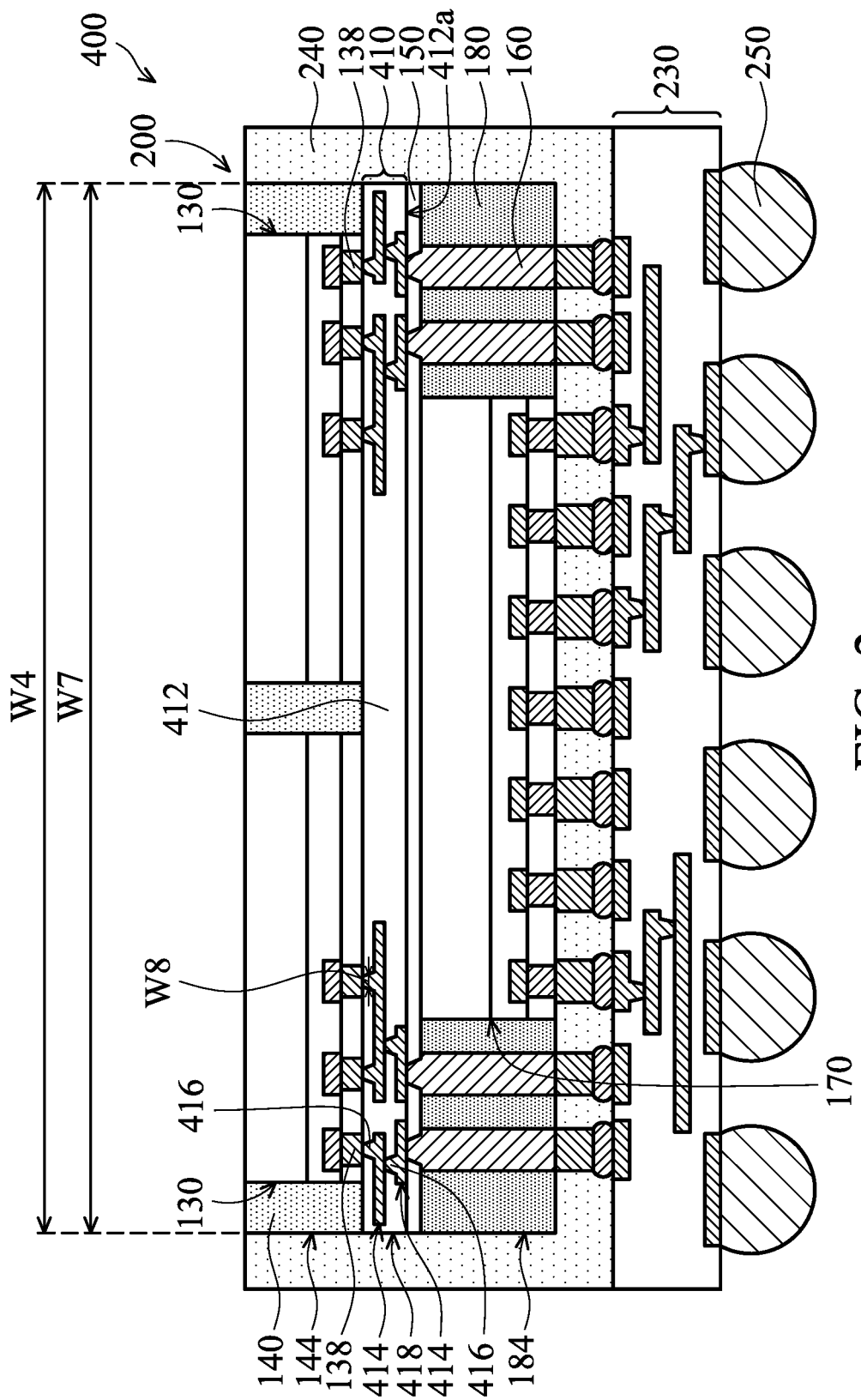
FIG. 2 is a cross-sectional view of a chip package structure, in accordance with some embodiments.

FIG. 2 is a cross-sectional view of a chip package structure 400, in accordance with some embodiments. As shown in FIG. 2, the chip package structure 400 is similar to the chip package structures 300 of FIG. 1J, except that the chip package structure 400 further includes a redistribution layer 410, in accordance with some embodiments.

The redistribution layer 410 is positioned between the molding layers 140 and 180, between the chip structures 130 and the molding layer 180, between the chip structures 130 and 170, between the molding layer 140 and the chip structure 170, and between the chip structures 130 and the conductive via structures 160, in accordance with some embodiments.

The redistribution layer 410 includes a dielectric layer 412, wiring layers 414, and conductive vias 416, in accordance with some embodiments. The wiring layers 414 and conductive vias 416 are in the dielectric layer 412, in accordance with some embodiments. The conductive vias 416 are between the wiring layers 414 and the interconnection structures 138, in accordance with some embodiments.

Therefore, the interconnection structures 138 and the wiring layers 414 are able to be electrically connected to each other through the conductive vias 416 according to design requirements, in accordance with some embodiments. The width W8 of each of the conductive vias 416 continuously increases toward a bottom surface 412a of the dielectric layer 412, in accordance with some embodiments.

The redistribution layer 410 is in direct contact with the chip structures 130, the molding layers 140 and 240, the conductive via structures 160, and the insulating layer 150, in accordance with some embodiments. The sidewalls 184, 144, and 418 of the molding layers 180 and 140 and the redistribution layer 410 are coplanar, in accordance with some embodiments. In some embodiments, a width W7 of the redistribution layer 410 is substantially equal to the width W4 of the chip package structure 200.

Figure 3:
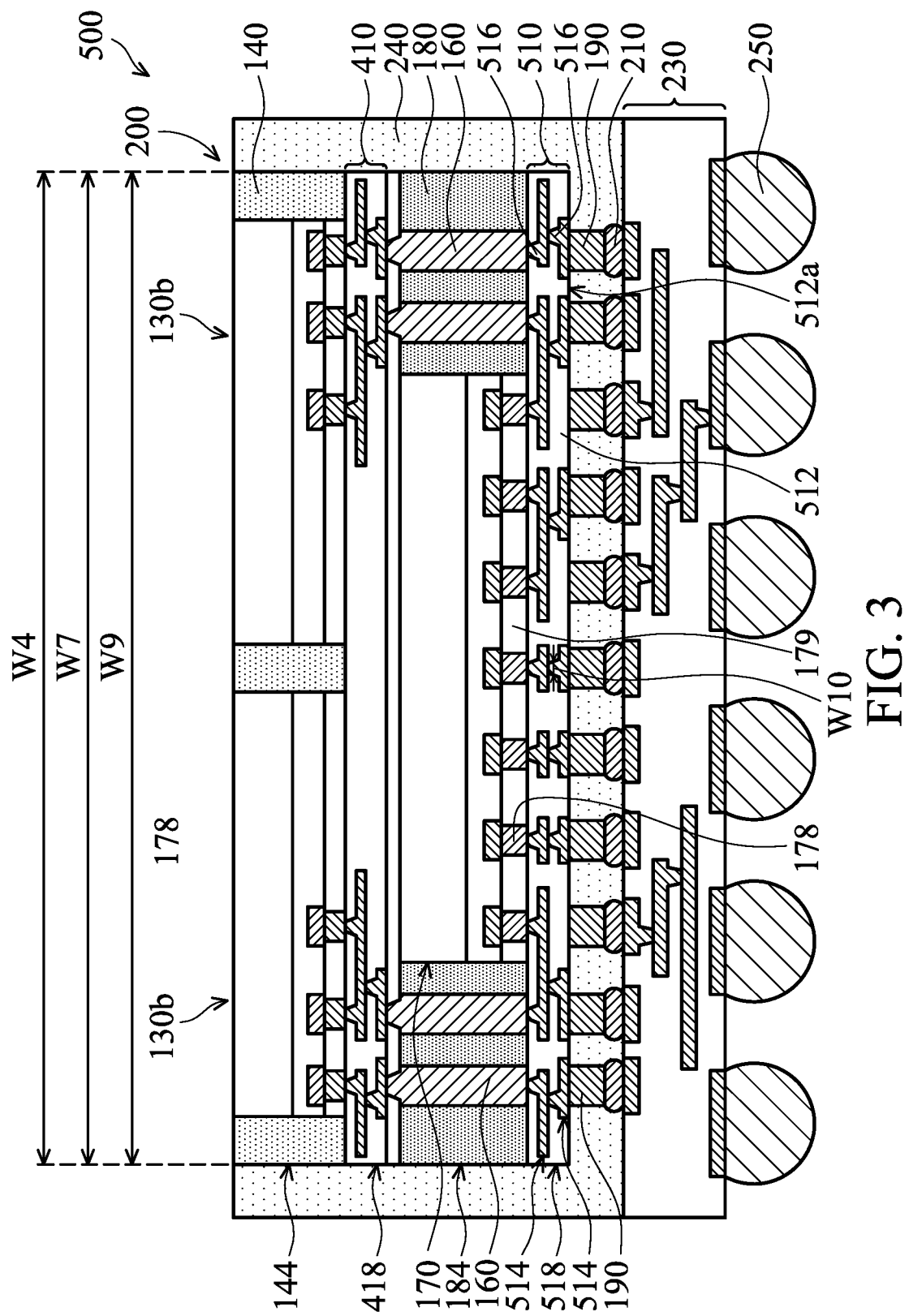
FIG. 3 is a cross-sectional view of a chip package structure, in accordance with some embodiments.

FIG. 3 is a cross-sectional view of a chip package structure 500, in accordance with some embodiments. As shown in FIG. 3, the chip package structure 500 is similar to the chip package structures 400 of FIG. 2, except that the chip package structure 500 further includes a redistribution layer 510, in accordance with some embodiments.

The redistribution layer 510 is positioned between the molding layers 240 and 180, between the chip structure 170 and the molding layer 240, between the chip structure 170 and the conductive pillars 190, and between the conductive via structures 160 and the conductive pillars 190, in accordance with some embodiments.

The redistribution layer 510 includes a dielectric layer 512, wiring layers 514, and conductive vias 516, in accordance with some embodiments. The wiring layers 514 and conductive vias 516 are in the dielectric layer 512, in accordance with some embodiments. The conductive vias 516 are between the wiring layers 514 and the interconnection structures 178, in accordance with some embodiments.

Therefore, the interconnection structures 178 and the wiring layers 514 are able to be electrically connected to each other through the conductive vias 516 according to design requirements, in accordance with some embodiments. The width W10 of each of the conductive vias 516 continuously increases toward a bottom surface 512a of the dielectric layer 512, in accordance with some embodiments.

The redistribution layer 510 is in direct contact with the chip structures 170, the molding layers 180 and 240, the conductive via structures 160, and the conductive pillars 190, in accordance with some embodiments. The sidewalls 184, 144, 418, and 518 of the molding layers 180 and 140 and the redistribution layers 410 and 510 are coplanar, in accordance with some embodiments. In some embodiments, the width W7 of the redistribution layer 410, the width W4 of the chip package structure 200, and a width W9 of the redistribution layer 510 are substantially equal to each other.

Figure 4A:
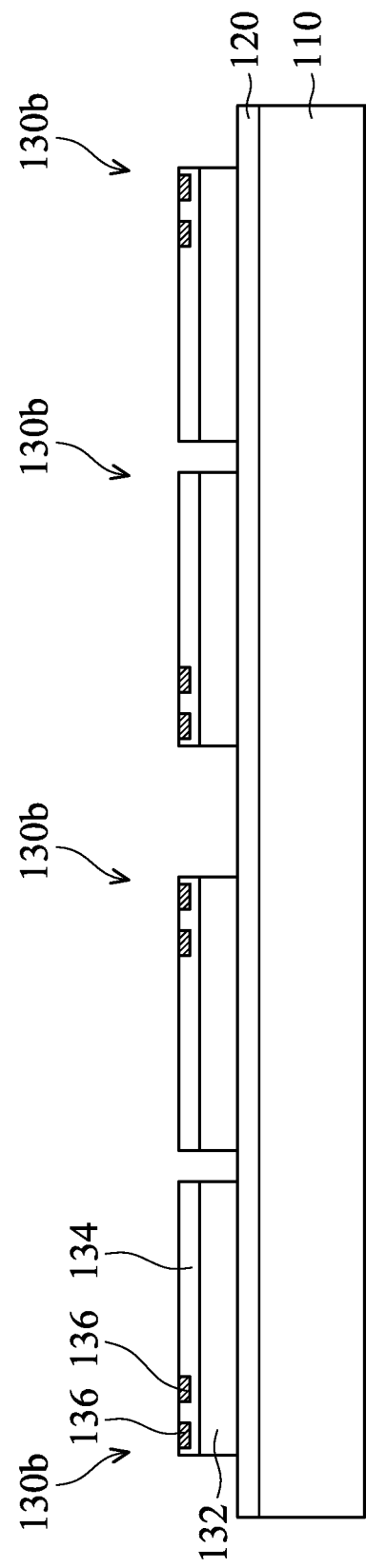
FIGS. 4A-4C are cross-sectional views of various stages of a process for forming a chip package structure, in accordance with some embodiments.
Figure 4B:
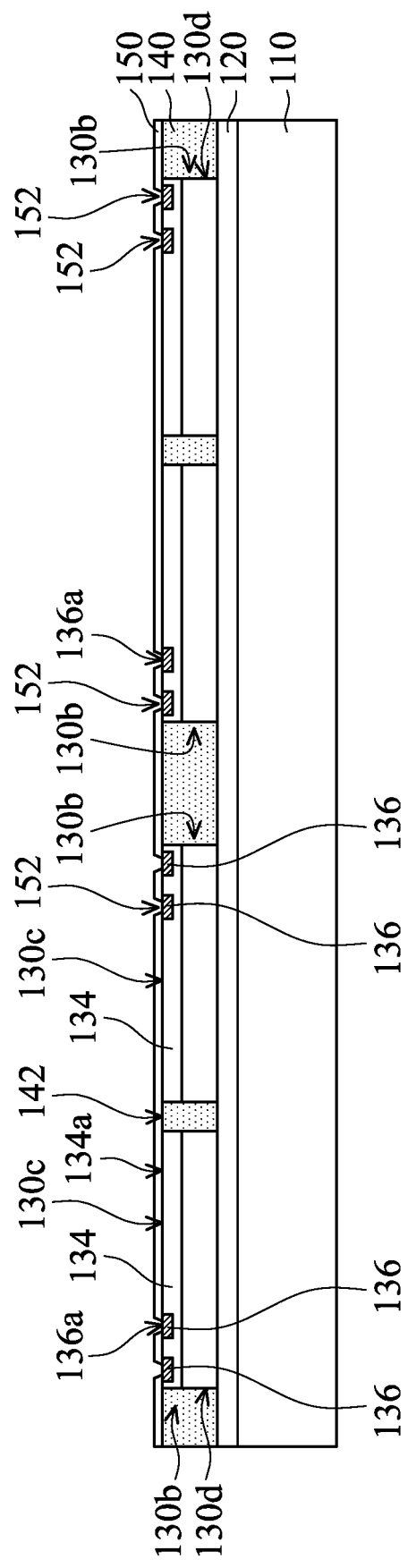
Figure 4C:
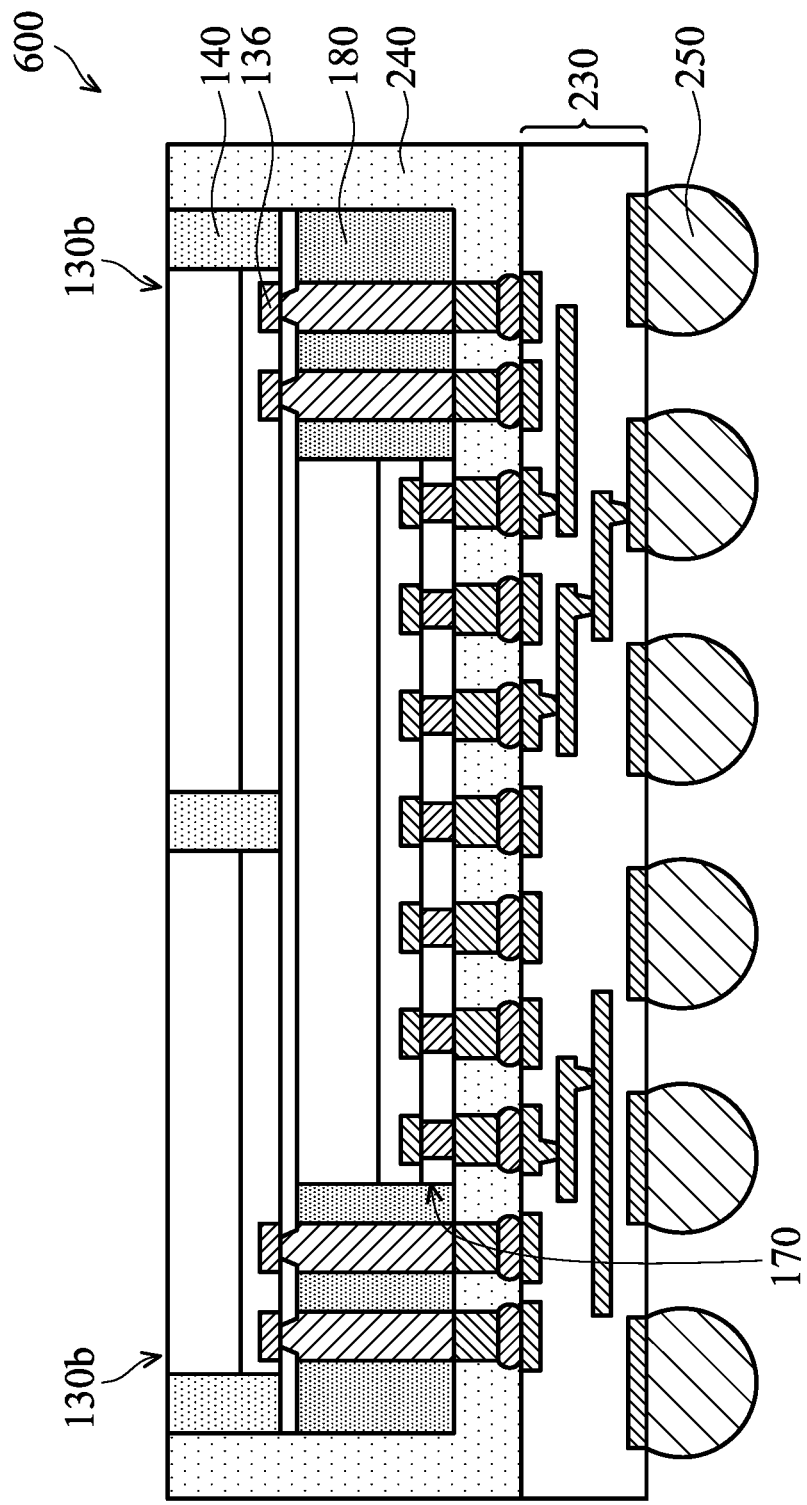

FIGS. 4A-4C are cross-sectional views of various stages of a process for forming a chip package structure, in accordance with some embodiments. As shown in FIG. 4A, a carrier substrate 110 and an adhesive layer 120 are provided, in accordance with some embodiments. Materials, structures, and positions of the carrier substrate 110 and the adhesive layer 120 of FIG. 4A are similar to or the same as the materials, the structures, and the positions of the carrier substrate 110 and the adhesive layer 120 of FIG. 1A, in accordance with some embodiments.

As shown in FIG. 4A, chip structures 130b are provided over the adhesive layer 120, in accordance with some embodiments. The chip structures 130b of FIG. 4A are similar to the chip structures 130 of FIG. 1A, except that each of the chip structures 130b does not include interconnection structures 138 and a passivation layer 139, in accordance with some embodiments.

As shown in FIG. 4B, a molding layer 140 is formed over the carrier substrate 110 and the adhesive layer 120, in accordance with some embodiments. The molding layer 140 surrounds the chip structures 130b, in accordance with some embodiments. In some embodiments, portions of the molding layer 140 are located between the chip structures 130b. The molding layer 140 includes a polymer material or another suitable insulating material.

The formation of the molding layer 140 includes a transfer molding process, in accordance with some embodiments. The transfer molding process includes: providing a mold over the adhesive layer 120, wherein a top plate portion of the mold is in direct contact with the top surfaces 136a and 134a of the bonding pads 136 and the dielectric layer 134, and there is a space between sidewall portions of the mold and sidewalls 130d of the chip structures 130b; injecting a molding compound material into the space; performing a curing process to cross-link (or thermoset) the polymers of the molding compound material; and removing the mold.

Since the top plate portion of the mold is in direct contact with the top surfaces 136a and 134a, the molding layer 140 exposes the bonding pads 136 and the dielectric layer 134, in accordance with some embodiments. Therefore, there is no need to perform a grinding process over the molding compound material layer to expose the bonding pads 136.

As a result, there is no need to form the interconnection structures and the passivation layer over the bonding pads 136 to prevent the bonding pads 136 from damage caused by the grinding process, in accordance with some embodiments. Therefore, the cost of the chip structures 130b is reduced, in accordance with some embodiments. In some embodiments, the top surfaces 136a, 134a, 130c, and 142 of the bonding pads 136, the dielectric layer 134, the chip structures 130b, and the molding layer 140 are coplanar (or aligned with each other).

As shown in FIG. 4B, an insulating layer 150 is formed over the molding layer 140 and the chip structures 130b, in accordance with some embodiments. The insulating layer 150 is a continuous layer, in accordance with some embodiments. The insulating layer 150 has holes 152 over the bonding pads 136, respectively, in accordance with some embodiments. The holes 152 respectively expose the bonding pads 136 thereunder, in accordance with some embodiments.

After performing the steps in FIGS. 1C-1J, as shown in FIG. 4C, a chip package structure 600 is substantially formed, in accordance with some embodiments. The chip package structure 600 is similar to the chip package structure 300 of FIG. 1J, except that each of the chip structures 130b of the chip package structure 600 does not include interconnection structures 138 and the passivation layer 139 of the chip package structure 300 of FIG. 1J, in accordance with some embodiments. Therefore, the cost of the chip package structure 600 is reduced, in accordance with some embodiments.

Figure 5:
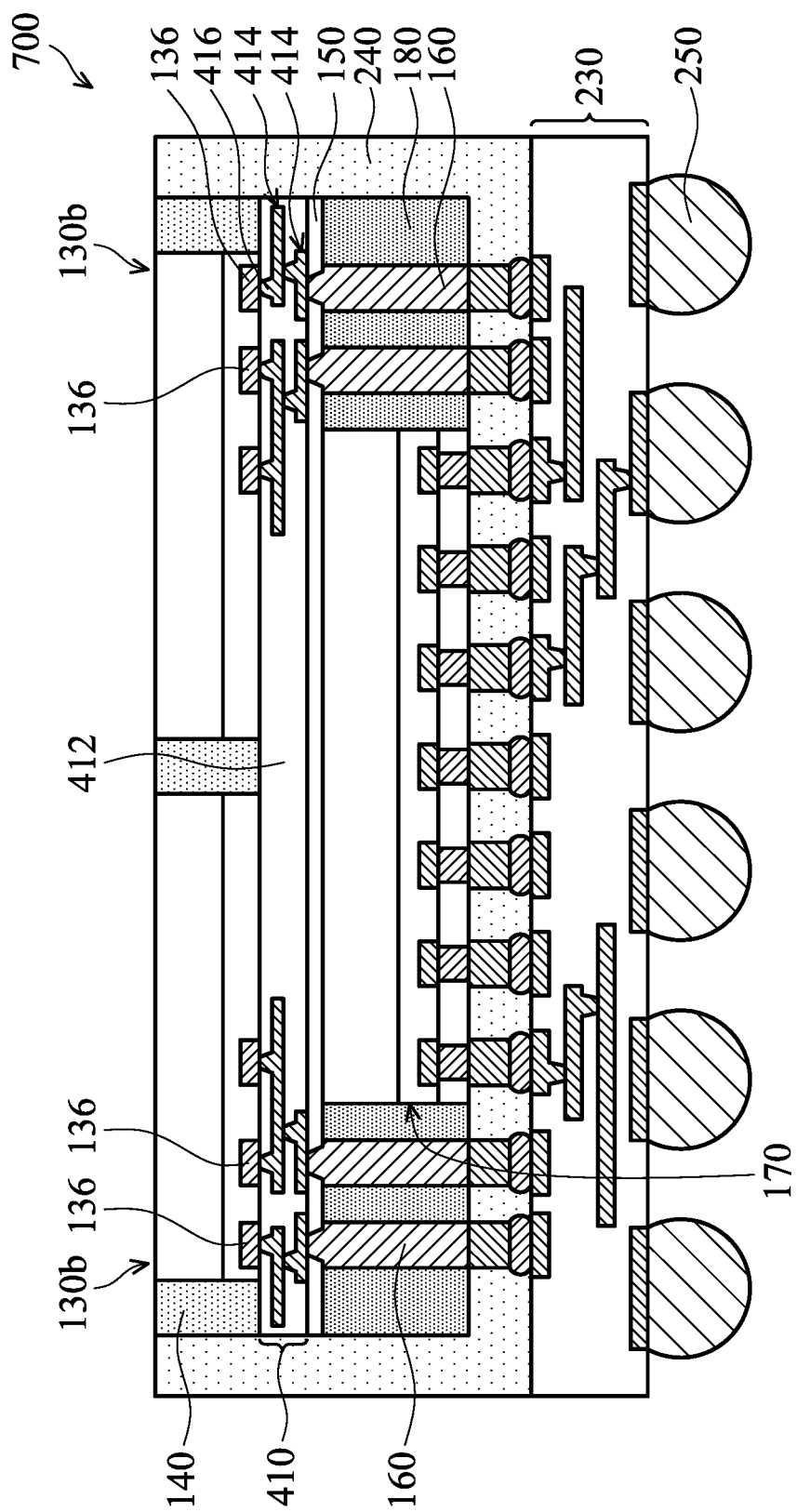
FIG. 5 is a cross-sectional view of a chip package structure, in accordance with some embodiments.

FIG. 5 is a cross-sectional view of a chip package structure 700, in accordance with some embodiments. As shown in FIG. 5, the chip package structure 700 is similar to the chip package structures 600 of FIG. 4C, except that the chip package structure 700 further includes a redistribution layer 410, in accordance with some embodiments.

The redistribution layer 410 of FIG. 5 is the same as the redistribution layer 410 of FIG. 2, in accordance with some embodiments. The redistribution layer 410 is positioned between the molding layers 140 and 180, between the chip structures 130b and the molding layer 180, between the chip structures 130b and 170, between the molding layer 140 and the chip structure 170, and between the chip structures 130b and the conductive via structures 160, in accordance with some embodiments.

The redistribution layer 410 includes a dielectric layer 412, wiring layers 414, and conductive vias 416, in accordance with some embodiments. The wiring layers 414 and conductive vias 416 are in the dielectric layer 412, in accordance with some embodiments. The conductive vias 416 are between the wiring layers 414 and the bonding pads 136, in accordance with some embodiments.

Therefore, the bonding pads 136 and the wiring layers 414 are able to be electrically connected to each other through the conductive vias 416 according to design requirements, in accordance with some embodiments. The redistribution layer 410 is in direct contact with the chip structures 130b, the molding layers 140 and 240, the conductive via structures 160, and the insulating layer 150, in accordance with some embodiments.

Figure 6:
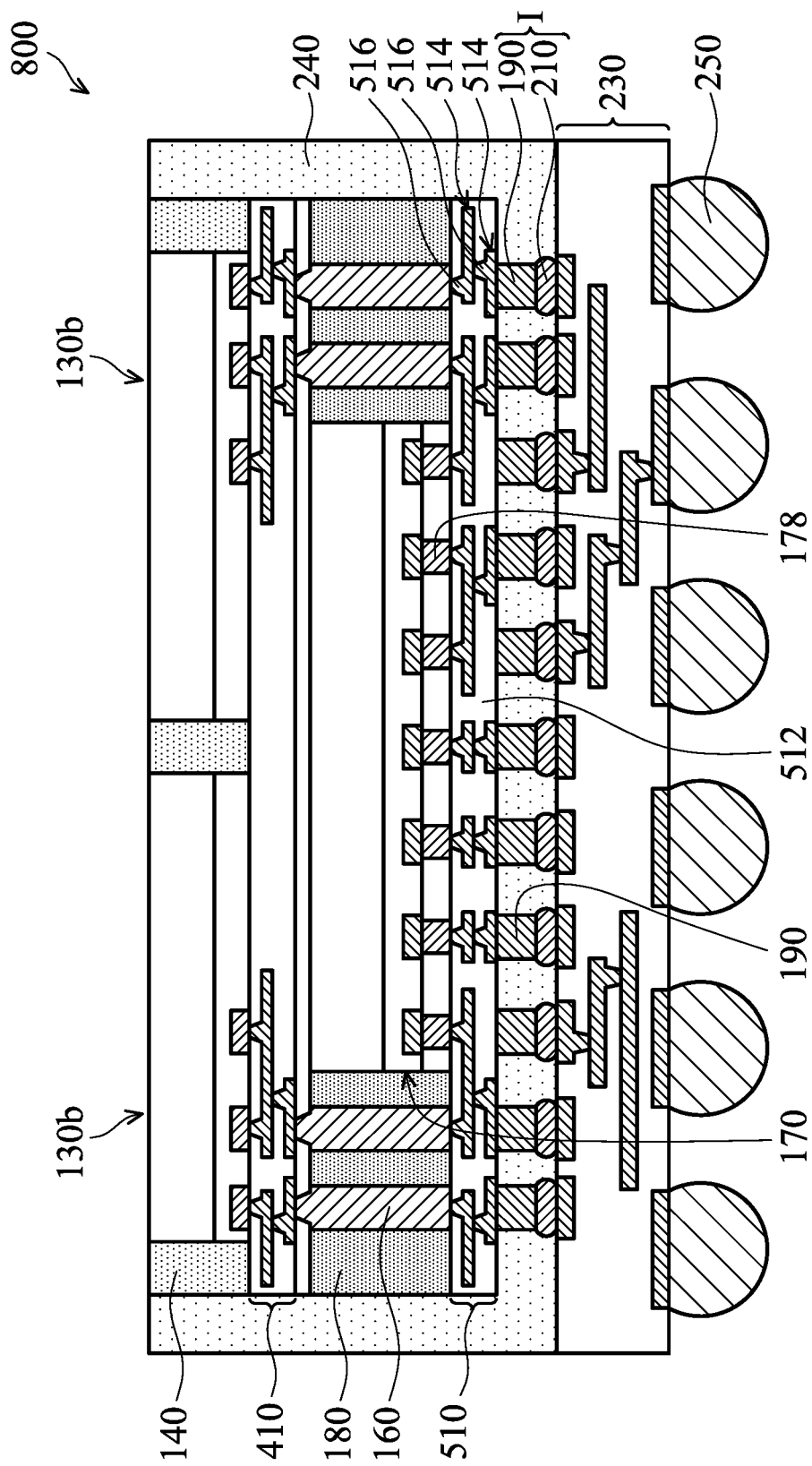
FIG. 6 is a cross-sectional view of a chip package structure, in accordance with some embodiments.

FIG. 6 is a cross-sectional view of a chip package structure 800, in accordance with some embodiments. As shown in FIG. 6, the chip package structure 800 is similar to the chip package structures 700 of FIG. 5, except that the chip package structure 800 further includes a redistribution layer 510, in accordance with some embodiments.

The redistribution layer 510 of FIG. 6 is the same as the redistribution layer 510 of FIG. 3, in accordance with some embodiments. The redistribution layer 510 is positioned between the molding layers 240 and 180, between the chip structure 170 and the molding layer 240, between the chip structure 170 and the conductive pillars 190, and between the conductive via structures 160 and the conductive pillars 190, in accordance with some embodiments.

The redistribution layer 510 includes a dielectric layer 512, wiring layers 514, and conductive vias 516, in accordance with some embodiments. The wiring layers 514 and conductive vias 516 are in the dielectric layer 512, in accordance with some embodiments. The conductive vias 516 are between the wiring layers 514 and the interconnection structures 178, in accordance with some embodiments.

Therefore, the interconnection structures 178 and the wiring layers 514 are able to be electrically connected to each other through the conductive vias 516 according to design requirements, in accordance with some embodiments. The redistribution layer 510 is in direct contact with the chip structures 170, the molding layers 180 and 240, the conductive via structures 160, and the conductive pillars 190, in accordance with some embodiments.

In accordance with some embodiments, chip package structures and methods for forming the same are provided. The methods (for forming the chip package structure) include forming a multi-chip stacked package structure and a redistribution structure individually; bonding the multi-chip stacked package structure onto the redistribution structure; and forming a molding layer over the redistribution structure and surrounding the multi-chip stacked package structure. Therefore, chips of the multi-chip stacked package structure are prevented from being affected by the thermal processes for forming dielectric layers of the redistribution structure. Therefore, the performance of the chips is maintained. The yield of the chip package structures with the chips is improved.

In accordance with some embodiments, a chip package structure is provided. The chip package structure includes a redistribution structure. The chip package structure includes a first chip structure over the redistribution structure. The chip package structure includes a first solder bump arranged between and electrically connecting the redistribution structure and the first chip structure. The chip package structure includes a first molding layer surrounding the first chip structure, wherein the first molding layer and the first chip structure are spaced apart from the redistribution structure by the first solder bump, thereby defining a gap there-between. The chip package structure includes a second chip structure over the first chip structure. The chip package structure includes a second molding layer surrounding the second chip structure. The chip package structure includes a third molding layer surrounding the first molding layer, the second molding layer, and the first solder bump, and filled into the gap.

In accordance with some embodiments, a chip package structure is provided. The chip package structure includes a redistribution structure. The chip package structure includes a first chip structure over the redistribution structure. The chip package structure includes a first molding layer surrounding the first chip structure. The first molding layer and the first chip structure are spaced apart from the redistribution structure by a gap. The chip package structure includes a first solder bump arranged between and electrically connecting the redistribution structure and the first chip structure. The chip package structure includes a first conductive pillar in the gap and under the first chip structure. The first solder bump is arranged between the first conductive pillar and the redistribution structure. The first solder bump and the first conductive pillar together form an interconnect structure, and a thickness of the interconnect structure is substantially equal to a distance between the first chip structure and the redistribution structure. The chip package structure includes a second chip structure over at least one of the first chip structure and the first molding layer. The chip package structure includes a second molding layer surrounding the second chip structure. The chip package structure includes a third molding layer surrounding the first molding layer, the second molding layer, the first solder bump, and the first conductive pillar, and filled into the gap.

In accordance with some embodiments, a chip package structure is provided. The chip package structure includes a redistribution structure. The chip package structure includes a first chip structure over the redistribution structure. The chip package structure includes a first solder bump arranged between and electrically connecting the redistribution structure and the first chip structure. The chip package structure includes a first molding layer surrounding the first chip structure. The first molding layer and the first chip structure are spaced apart from the redistribution structure by the first solder bump, thereby defining a gap there-between. The chip package structure includes a second chip structure over the first chip structure. The chip package structure includes a second molding layer surrounding the second chip structure. The chip package structure includes a conductive via structure passing through the first molding layer and electrically connected to the second chip structure. The chip package structure includes a second solder bump in the gap and between the conductive via structure and the redistribution structure. The chip package structure includes a third molding layer surrounding the first molding layer, the second molding layer, the first solder bump, and the second solder bump, and filled into the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, the method comprising:
    forming a first encapsulant along sidewalls of a first chip structure and a second chip structure;
    forming one or more insulating layers over the first encapsulant the first chip structure, and the second chip structure;
    attaching a third chip structure to the one or more insulating layers;
    forming a first through via over the one or more insulating layers;
    forming a second encapsulant over the one or more insulating layers, the second encapsulant extending along sidewalls of the third chip structure and the first through via; and
    forming a third encapsulant along sidewalls of the first encapsulant, the one or more insulating layers, and the second encapsulant.

2. The method of claim 1, wherein first contact pads of the third chip structure face away from the first chip structure.

3. The method of claim 2, further comprising bonding the first contact pads of the third chip structure directly to a substrate.

4. The method of claim 3, wherein bonding the first contact pads of the third chip structure is performed prior to forming the third encapsulant.

5. The method of claim 4, wherein forming the first through via comprises forming the first through via through the one or more insulating layers to a second contact pad of the first chip structure.

6. The method of claim 4 wherein the third encapsulant extends between the third chip structure and the substrate.

7. A method for forming a chip package structure, the method comprising:
    forming a first encapsulant along sidewalls of one or more first chip structures;
    forming a first interconnect structure over the first encapsulant and the one or more first chip structures;
    attaching a second chip structure to the first interconnect structure;
    forming a through via over the first interconnect structure;
    forming a second encapsulant along sidewalls of the second chip structure and the through via; and
    forming a third encapsulant along sidewalls of the first encapsulant and the second encapsulant.

8. The method of claim 7, wherein major surfaces of the one or more first chip structures are free of the first encapsulant and the second encapsulant.

9. The method of claim 7, further comprising, prior to forming the third encapsulant, forming a second interconnect structure over the second chip structure, the through via, and the second encapsulant.

10. The method of claim 9, wherein the first interconnect structure comprises a first via, wherein a width of the first via decreases as the first via extends away from the one or more first chip structures.

11. The method of claim 10, wherein the second interconnect structure comprise a second via, wherein a width of the second via decreases as the second via extends away from the second chip structure.

12. The method of claim 7, wherein the third encapsulant contacts a sidewall and a bottom of the second encapsulant.

13. A method for forming a chip package structure, the method comprising:
    forming a first encapsulant along sidewalls of a first chip structure;
    forming one or more insulating layers over the first encapsulant and the first chip structure;
    attaching a second chip structure to the one or more insulating layers;
    forming a first through via over the one or more insulating layers;
    forming a second encapsulant over the one or more insulating layers, the second encapsulant extending along sidewalls of the second chip structure, wherein forming the second encapsulant comprises forming the second encapsulant along sidewalls of the first through via; and
    forming a third encapsulant along sidewalls of the first encapsulant, the one or more insulating layers, and the second encapsulant.

14. The method of claim 13, further comprising, prior to forming the third encapsulant, bonding the second chip structure to a substrate.

15. The method of claim 14, wherein forming the third encapsulant comprises forming the third encapsulant between the second chip structure and the substrate.

16. The method of claim 14, further comprising:
    forming conductive redistribution lines in the one or more insulating layers, wherein contact pads of the first chip structure are electrically coupled to corresponding ones of the conductive redistribution lines; and
    forming a redistribution structure over the second chip structure and the second encapsulant prior to forming the third encapsulant.

17. The method of claim 16, wherein forming the third encapsulant comprises forming the third encapsulant along sidewalls of the redistribution structure.

18. The method of claim 17, wherein the first through via extends through the one or more insulating layers.

19. The method of claim 13, wherein, after forming the third encapsulant, lateral edges of the first encapsulant are aligned with lateral edges of the second encapsulant.

20. The method of claim 18, wherein a width of the first through via in the one or more insulating layers is less than a width of the first through via in the second encapsulant.

* * * * *